United States Patent [19]

Daffarn

[11] Patent Number: 4,821,036

[45] Date of Patent: Apr. 11, 1989

[54] METHOD OF AND APPARATUS FOR PRODUCING A DIGITAL INDICATION OF THE TIME-INTEGRAL OF AN ELECTRIC CURRENT

[75] Inventor: Patrick A. Daffarn, Crawley, England

[73] Assignee: U.S. Philips Corp., New York, N.Y.

[21] Appl. No.: 147,611

[22] Filed: Jan. 19, 1988

Related U.S. Application Data

[63] Continuation of Ser. No. 889,440, Jul. 23, 1986, abandoned.

[30] Foreign Application Priority Data

Jul. 26, 1985 [GB] United Kingdom ............... 8518963

[51] Int. Cl.⁴ .......................................... H03M 1/38
[52] U.S. Cl. .................................. 341/172; 341/158; 341/161; 250/214 DC
[58] Field of Search ............... 340/347 AD, 347 M; 307/304; 357/24; 250/214 DC; 341/155-161, 172

[56] References Cited

U.S. PATENT DOCUMENTS

| | | | |
|---|---|---|---|
| 3,958,210 | 5/1976 | Levine | 365/183 |
| 4,072,939 | 2/1978 | Heller et al. | 340/347 AD |
| 4,136,335 | 1/1979 | Tompsett | 340/347 AD |
| 4,320,390 | 3/1982 | Scott | 340/347 NT |
| 4,485,372 | 11/1984 | Holloway | 340/347 NT X |

Primary Examiner—Vit W. Miska
Assistant Examiner—Brian Young
Attorney, Agent, or Firm—Bernard Franzblau

[57] ABSTRACT

A digital representation of the time-integral of the illumination-dependent electric current flowing in a photo-conductive diode (1) is produced by feeding the current initially to the first capacitor (3a) of a series of capacitors (3a–3d). When the voltage across this first capacitor reaches a predetermined value the current is subsequently directed to the next capacitor (3b) of the series, and so on for the remaining capacitors (3c, 3d) sequence succession, by means of a voltage level responsive coupling circuit (6). At the end of the integration period the voltage level in that capacitor which is only partly charged at that time is converted into digital form by means of a corresponding analog-to-digital converter (16) and applied to an output (18) together with a code identifying from which capacitor the digital output has been derived. If the number of capacitors and also the capacitance of each capacitor relative to that of the previous one is suitably chosen, the arrangement can cope with a very large range of values of the integral of the input current. The capacitors together with the coupling means (6) may be replaced by a charge-coupled device structure comprising a series of charge wells, where each well can overflow into the next well of the series.

10 Claims, 2 Drawing Sheets

METHOD OF AND APPARATUS FOR PRODUCING A DIGITAL INDICATION OF THE TIME-INTEGRAL OF AN ELECTRIC CURRENT

This is a continuation of application Ser. No. 889,440, filed July 23, 1986, now abandoned.

This invention relates to apparatus for, and a method of, producing a digital representation of the time-integral of an electric current.

As is known, a voltage representative of the time-integral of an electric current can be produced by feeding the current into a capacitor, the resulting voltage change across the capacitor after a given time being a measure of the time-integral. If processing of the result is required, it is often convenient to convert the voltage into a digital representation thereof before the processing is carried out. One of the many known voltage-to-digital converters may be used for this purpose. This technique in its basic form has disadvantages if the range of possible values of the time-integral is very large, for example in the order of 80 dB, because the range of voltages across the capacitor will likewise be very large. If the capacitance of the capacitor is chosen to be small to obtain a reasonably large and hence easily convertible voltage for small values of the time-integral, large values of the time-integral will give rise to very large capacitor voltages, which may be difficult to manage and may even have a retroactive effect on the input current. Conversely, if the capacitance of the capacitor is chosen to be large, large values of the time-integral will be comparatively easy to accommodate but small values of the time-integral will give rise to such small voltages that these may become lost in noise etc. It is an object of the invention to mitigate this disadvantage.

SUMMARY OF THE INVENTION

According to one aspect, the invention provides apparatus for producing a digital representative of the time-integral of an electric current, comprising an input for said electric current, a set of capacitive elements, coupling means from said input to each element of the set, which coupling means is voltage-level responsive in that, taking the capacitive elements in a given sequence, it is arranged to selectively direct current flowing in said input at any given time to that element of the set which lies nearest the beginning of the sequence of all those elements (if present) the voltage across which lies below a predetermined value at that time, means for setting the voltage across each said capacitive element to a reference value at a given instant, a voltage-to-digital converter for at a subsequent instant generating a digital representation of the deviation from the corresponding reference value of the voltage across the last of the elements of the set to which the input current has been directed since said given instant, and means for generating a digital code identifying which of the elements this is.

According to another aspect, the invention provides a method of producing a digital representation of the time-integral of an electric current, in which the voltage level across each member of a set of capacitive elements is set to a reference value, taking the elements in a given sequence the current is subsequently fed at any given time to that element of the set which lies nearest the beginning of the sequence of all those (if present) the voltage across which lies below a predetermined value at that time, and a digital representation is then generated of the deviation from the corresponding reference value of the voltage across the last of the elements of the set to which the current has been so directed together with a digital code identifying which of the elements this is.

It has now been recognized that it is possible, in effect, to automatically adapt the size of the capacitance employed to the value of the time-integral by, when the voltage across the charging (or discharging) capacitive element reaches a predetermined value, arranging that further input current is directed to a further capacitive element. Such redirection can be repeated when the voltage across the further capacitive element reaches a predetermined value, and so on. In this way the maximum voltage across any capacitive element can be limited to a predetermined value so that a comparatively small capacitance can be automatically employed when the value of the time-integral is itself small.

The coupling means may comprise a coupling from said input to the first element of the sequence and a voltage-level responsive coupling from each element of the sequence to the next element of the sequence (if present), which voltage level responsive coupling is such as to be conductive if the voltage level at its input has a predetermined value and to be substantially non-conductive if the voltage level at its input is less than said predetermined value. If this is the case the capacitive elements may conveniently take the form of charge wells formed in a slice of semiconductor material and the voltage-level responsive couplings take the form of potential barriers between the wells forming the corresponding capacitive elements.

The output/input characteristic of the apparatus is conveniently made logarithmic. Such a characteristic can be obtained if the voltage-to-digital converter is chosen to itself have an output/input characteristic which is logarithmic to the base B and arranging that the capacitance of each capacitive element is $B^{N-1}$ times the capacitance of that capacitive element (if any) which immediately precedes it in the sequence, where N is the number of possible values of the output of the voltage-to-digital converter.

Embodiments of the invention will now be described, by way of example, with refernce to the accompanying diagrammatic drawings.

DESCRIPTION OF THE PREFERRED EMBODIMENT

Figure 1:
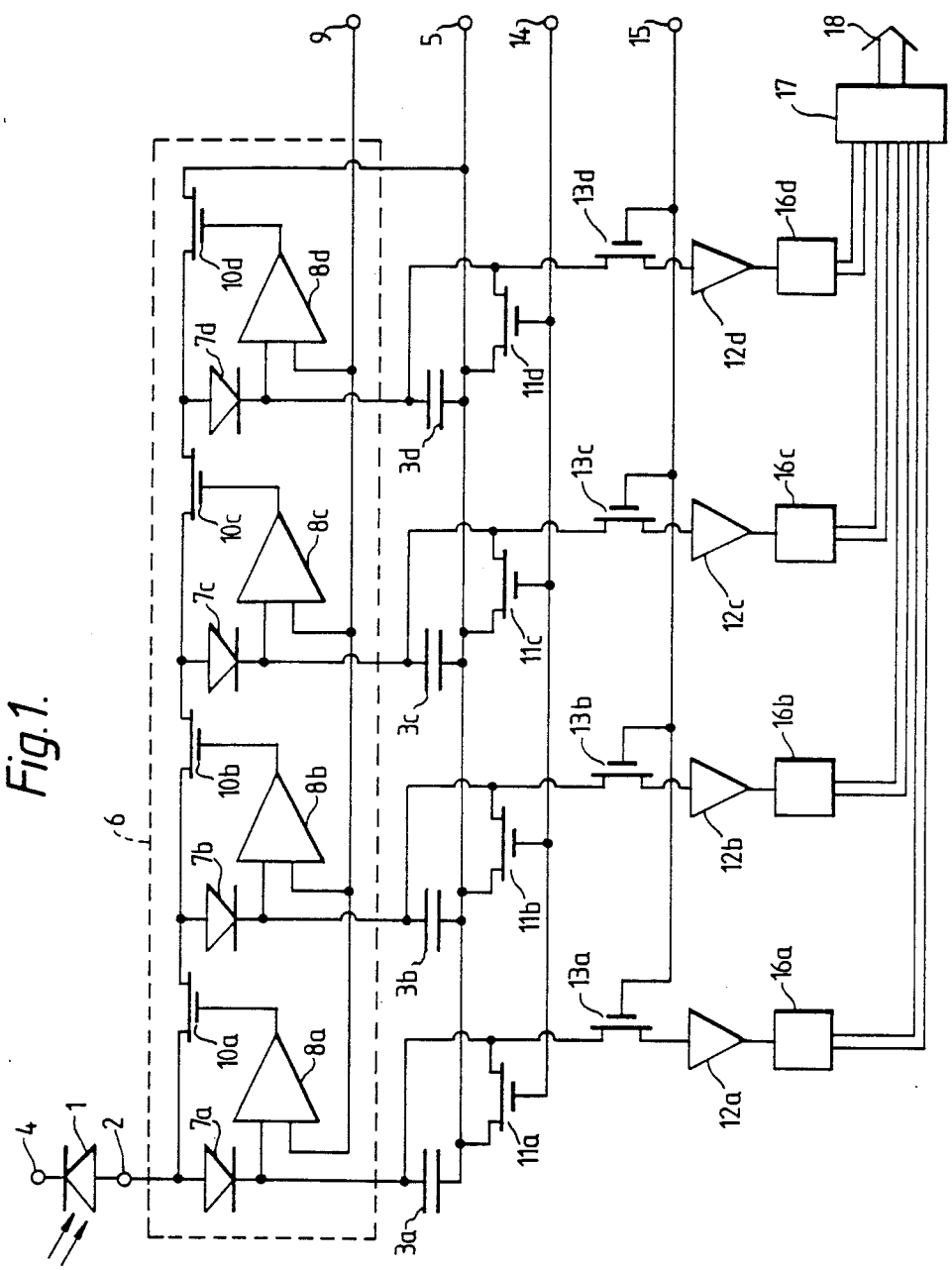
FIG. 1 is the circuit diagram of a first embodiment.

In FIG. 1, apparatus for producing a digital representation of the time-integral of an electric current, in the present case an illumination-dependent electric current flowing in a photo-conductive diode 1 from a positive voltage supply terminal 4, comprises an input 2 for the current and a set of capacitive elements in the form of capacitors 3a, 3b, 3c and 3d one electrode of each of which is connected to a ground terminal 5. Voltage-level responsive coupling means 6 couples the input 2 to the other electrode of each of the capacitors 3a-3d. Coupling means 6 comprises a diode, 7a, 7b, 7c and 7d respectively, corresponding to each of the capacitors 3a ... 3d, which diode has its cathode connected to the corresponding capacitor, a comparator, 8a, 8b, 8c and 8d respectively, corresponding to each capacitor, which comparator has one of its inputs connected to the corresponding capacitor and its other input connected to a positive reference voltage supply terminal 9, and a field-effect transistor switch element, 10a, 10b, 10c and 10d respectively, corresponding to each capacitor, which switch element has its gate connected to the output of the corresponding comparator and its source-drain path connected between the anode of the corresponding diode and the anode of the diode corresponding to the next capacitor of the series (if present). The source-drain path of switch element 10d is connected between the anode of the diode 7d and ground. Input terminal 2 is connected to the anode of the diode 7a.

The common point of each capacitor 3 and its associated diode 7 is connected to ground via the source-drain path of a corresponding further field-effect transistor switch element 11a, 11b, 11c, and 11d respectively, and also to the input of a corresponding amplifier 12a, 12b, 12c and 12d respectively via the source-drain path of another corresponding field-effect transistor switch element 13a, 13b, 13c and 13d respectively. The gates of the transistors 11a–11d are connected to a reset signal input terminal 14 and the gates of the transistors 13a–13d are connected to a read signal input terminal 15.

The outputs of the amplifiers 12a–12d are each connected to the input of a corresponding analog-to-digital converter 16a, 16b, 16c and 16d respectively the outputs of which are connected to a signal processing circuit 17. Circuit 17 has an output 18 which constitutes the output of the apparatus.

Each A/D converter produces a binary output code representative of the voltage across its corresponding capacitor 3 when a read pulse is applied to input 15. If a capacitor 3 is fully charged (to the reference voltage at terminal 9) the corresponding converter 16 produces a maximum code value, which means that all bits of the output code will be "1". Thus, whether or not a capacitor 3 is fully charged can be detected by means of an AND-gate in the processing circuit 17, such as the gate 19 in FIG. 2 having respective inputs fed from respective bit lines of the output of the relevant converter 16. Because the capacitors 3 are charged in sequence by means of the input current at terminal 2, charging of a given capacitor only commencing when the voltage across the preceding capacitor has reached the reference voltage at terminal 9, when a read pulse is applied to input 15 the number of capacitors 3 which are fully charged, and hence the number of AND-gates 19 of FIG. 2 which are producing a logic 1, is a coarse indicator of the current which flowed at terminal 2 in the interval since the preceding reset pulse was applied to terminal 14.

The identity of the last in the sequence of capacitors 3 which is fully charged, or the identity of the first of the sequence of capacitors 3 which is not fully charged, is itself indicative of the number of capacitors 3 which are fully charged, and thus itself may be used as a coarse indicator of the current which flowed at terminal 2 during the measuring interval.

The apparatus of FIG. 1 operates as follows. Initially a reset pulse is momentarily applied to the terminal 14 causing the transistors 11 to short-circuit the corresponding capacitors 3, i.e. to set the voltage across these capacitors to a reference value of zero. Under these conditions the comparators 8a–8d are each supplied with zero voltage from the corresponding capacitors 3a–3d, with the result that the output signal of each comparator holds the corresponding transistor switch 10a–10d in the non-conductive state. At the end of the reset pulse the current flowing in input terminal 2 starts to charge capacitor 3a through diode 7a. When the voltage across capacitor 3a reaches the reference voltage applied to terminal 9 comparator 8a produces an output signal which renders transistor 10a conductive. The current in input terminal 2 then starts to flow to capacitor 3b through diode 7b, rather than to capacitor 3a. Similarly, when the voltage across capacitor 3b reaches the reference voltage applied to terminal 9 comparator 8b renders transistor 10b conductive with the result that the current in input 2 now flows to capacitor 3c. Thus, if the current in input terminal 2 is allowed to flow long enough without another reset pulse being applied to input terminal 14, the capacitors of the sequence 3a, 3b, 3c and 3d are charged, in succession to the reference voltage at terminal 9. When capacitor 3d has become so charged any further current then is conducted to ground via the then-conductive transistor 10d. The amount of charge in the capacitors 3a–3d is therefore, so long as not all are fully charged, representative of the time-integral of the current which has flowed in input terminal 2 since the end of the last reset pulse.

When it is required to generate a digital number representative of this time-integral, a read plus is applied to input 15, causing the transistors 13a–13d to conduct and connect the capacitors 3a–3d to the inputs of the corresponding analog-to-digital converters 16a–16d via the respective amplifiers 12a–12d. The gains of the amplifiers 12a–12d are chosen so that each converter 16 produces its full-scale output when the voltage across the corresponding capacitor 3 is equal to the reference voltage at terminal 9. Processing circuit 17 detects from the outputs of the converters 16 which of these is the first (on going from 16a to 16d) whose output is not full-scale, i.e. which one of these corresponds to the last of the capacitors 3 to which the current in the input terminal 2 has been directed since the preceding reset pulse, and produces a set of bits at its output 18 representative of the output of this converter, and hence of the deviation of the voltage in the corresponding capacitor from zero, plus two further bits identifying to which converter 16, and hence to which capacitor 3, this set of bits corresponds.

Use of an apparent as shown in FIG. 1 is of particular advantage when the current at input terminal 2 can have a very large range of values, conversion of which by means of a conventional analog-to-digital converter would be liable to result in insufficient resolution at one end of the range and/or saturation of the converter at the other, as a suitable choice of the relative capacitances of the capacitors 3a–3d enables the sensitivity of the conversion process for different parts of the range to be tailored to that required. For example, if a logarithmic output/input characteristic is required the amplifiers 12 or the analog-to-digital converters 16 may themselves be chosen to have an output/input characteristic which is logarithmic to the base B say. (The output of an otherwise linear analog-to-digital converter may be given a logarithmic characteristic by means, for example, of a suitable look-up table). If the number of possible values of the digital output of each converter is N then the complete apparatus will have an output/input characteristic which is logarithmic to the base B if the capacitances of the capacitors 3a, 3b, 3c and 3d are in the ratio $C:B^{N-1}C:B^{2(N-1)}C:B^{3(N-1)}C$, i.e. if the capacitance of each capacitor is $B^{N-1}$ times the capacitance of the capacitor (if any) which immediately precedes it in the series. Obviously more capacitors having capacitance values in the required ratio, together with corresponding comparators, transistor switches, diodes, amplifiers and analog-to-digital converters, may be added as required to provide coverage of a still larger range of possible input current time-integrals. Similarly, less capacitors and their associated components may be employed if the dynamic range obtainable thereby is sufficient. It will be noted that, whatever the range covered, the voltage change across each capacitor is never more than the value of the reference voltage at terminal 9.

The output bit lines of the converters 16 could in principle themselves constitute the output of the apparatus. If the number of output bits of each converter is six, say, then with four converters the total number of output bits would then be twenty-four. The number of groups of four bit lines, starting from the least-significant end of the resulting twenty-four bit output word, for which all bits are logic "1" would then indicate the number of capacitors which have become fully charged and therefore identify the next one of the series as being the one which has been only partly charged. The four bits corresponding to this next capacitor would then indicate the degree to which this next capacitor has been charged. Such a large number of output bit lines is, however, somewhat unwieldy and a reduction could be obtained in this respect by indicating the number of capacitors which have been fully charged by means of two bits (when the total number of capacitors is four). There are many possible ways in which this may be done. It may be done, for example, by means of the construction for the signal processing circuit 17 of FIG. 1 shown in FIG. 2.

Figure 2:
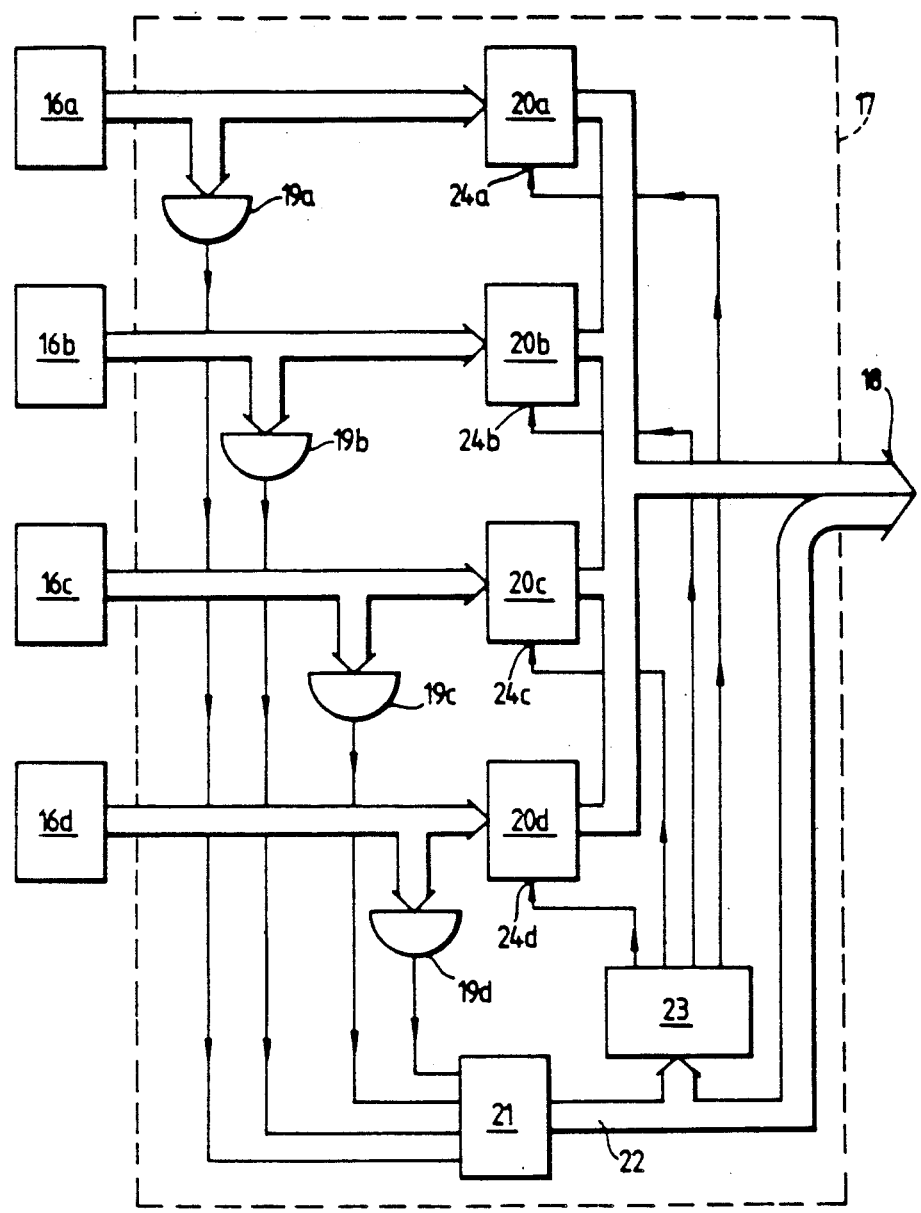
FIG. 2 shows a possible construction for one of the blocks in FIG. 1.

In FIG. 2 the circuit 17 comprises AND gates 19a, 19b, 19c and 19d respectively, corresponding to each converter 16 and having its inputs connected to the respective output bit lines of the corresponding converter, and multiple three-state buffers, 20a, 20b, 20c and 20d respectively, corresponding to each converter 16 and also having its inputs connected to the respective output bit lines of the corresponding converter. Each output bit line of each buffer 20 is connected in parallel with the corresponding output bit lines of the other buffers and constitutes one bit line of the apparatus output 18. The outputs of the AND-gates 19 are connected to respective inputs of a so-called priority encoder 21 which has two output bit lines 22 which constitute two further bit lines of the apparatus output 18 and are also connected to the input of a decoder 23. The four output lines of decoder 23 are connected to the enable inputs 24a, 24b, 24c and 24d of the buffers 20a, 20b, 20c and 20d respectively. Encoder 21 produces a two-bit output code which indicates which of the AND-gates 19 is the last in the series 19a-19d which is producing a logic "1" output signal, and hence which of the capacitors 3 of FIG. 1 is the last of the series 3a-3d which is completely charged. This two-bit code, in addition to being applied to the output 18 as an indication of which of the capacitors 3 is only partly charged, is decoded by decoder 23, resulting in the application of an enable signal to the enable signal input 24 of that buffer 20 which corresponds to the capacitor 3 which is only partly charged, thereby conducting the output signal of the corresponding converter 16 to the output 18.

The identity of the last in the sequence of capacitors 3 which is fully charged is determined by means of the priority encoder 21 which produces a code indicative thereof. This code is thus a coarse indicator of the input current which has flowed and is used as part (the two most significant bits) of the output code. Any excess of the input current over and above that which resulted in the full charge of the capacitor(s) 3 is contained in the first of the sequence of capacitors which is not fully charged, any remaining capacitors still being fully discharged. The amount of this excess current is indicated by the output code of the corresponding converter 16 which is applied to the output 18 and is used as the remaining (least significant) bits of the output code of the apparatus.

As an example, assume only capacitor 3a was fully charged when the read pulse appears at input terminal 15, capacitor 3b then being partly charged and capacitors 3c and 3d remaining completely discharged. If each converter 16 has a four-bit output and the charge in capacitor 3b produces an output of 0110 from converter 16b the outputs of converters 16a, 16b, 16c and 16d will be, 1111, 0110, 0000, and 0000, respectively. Under these circumstances encoder 21 produces an output 01 indicating that only AND-gate 19a is producing a logic 1 and hence that only capacitor 3a is fully charge. This output is used as the two most significant bits of output 18 and also results in decoder 23 activating buffer 20b, thereby causing the output of converter 16b to coupled to output 18 as the four least significant bits. The code at output 18 is therefore 010110, which indicates that the current which flowed at input terminal 2 has been sufficient to (a) fully charge capacitor 3a and (b) to partially charge capacitor 3b to a voltage which, when converted by converter 16b results in an output code 0110. The code at output 18 is therefore a measure of the current which flowed at input terminal 2 during the measuring interval.

If the forward voltage drops across the diodes 7 of FIG. 1 give rise to difficulties, for example because of their temperature-dependence, the anode of each of these diodes may be fed in known manner via the non-inverting input and output of a respective operational amplifier the inverting input of which is connected to the cathode of the relevant diode, thereby reducing the voltage drop across each amplifier/diode combination to a very small value.

It will be evident that many modifications are possible to the apparatus shown in FIG. 1. For example, the voltage across each capacitor may be set to a value other than zero by means of the reset pulses applied to terminal 14, provided that this is taken into account when the subsequent voltage change across the various capacitors are converted by the converters 16. In fact the voltages to which the capacitors are reset need not even be the same for each capacitor. Another possibility is to provide only one analog-to-digital converter 16 and associated amplifier 12, provided that means are provided to switch the input of the associated amplifier to that capacitor which is the first in the series which has not become fully charged when read-out is required. Such means may be constituted, for example, by a single-pole multi-way controllable electronic switch having its pole connected to the amplifier input, its other contacts connected to the respective capacitors and its multi-bit control input fed from the outputs of the comparators 8, for example via respective set-reset flip-flops each of which is set when the corresponding comparator generates an output signal to make the corresponding transistor 10 conduct and all of which are reset by each reset pulse applied to terminal 14, so that each time a given transistor 10 is rendered conductive the amplifier input is connected to the next capacitor of the series. The control signal for the switch can then also be used to identify at the apparatus output to which capacitor the amplifier input has finally been connected. Yet another possibility is to connect the input end of the source-drain path of each switching transistor 10 directly to the input terminal 2 rather than indirectly via the source-drain paths of all the transistor switches 10 which precede the relevant transistor switch in the series.

It will be appreciated that the sequence of capacitors 3 of FIG. 1, together with the coupling means 6, effectively constitutes a sequence of charge wells (constituted by the capacitors) having the input terminal 2 connected to the first well and with a potential barrier between each well and the next of the sequence. When sufficient charge has been supplied to a given well to raise the potential therein to the height of the relevant potential barrier, any further charge supplied simply overflows into the next well of sequence. Such a sequence of charge wells can, as an alternative, be implemented using charge-coupled semiconductor device techniques, as will be evident to those skilled in the art. More particularly, the various wells may be implemented in a single slice of p-type silicon by providing suitably biassed electrodes on an insulator provided on a major surface of the slice, the bias on each electrode determining the depth of the well under that electrode. In such a case p+ implanted region may be provided between the region of each well and the region of the next of the sequence, the degree of doping of this implanted region determining the height of the relevant potential barrier. The capacity of each well can be tailored so that required by suitably choosing the area of the relevant electrode, its bias, and the height of the potential barrier between the relevant well and the next. If the sequence of wells extends in a given direction the charges in the various wells can then be read out in parallel at right angles to this direction into, for example, a charge-coupled device shift register structure, by lowering the potential on a transfer gate provided between the wells and such a shift-register structure formed on the same slice, and be subsequently applied to the relevant amplifiers 12 by clocking out the contents of the shift register structure. The shift register structure may be constructed using device technology as disclosed, for example, in published British patent specifications Nos. 1,414,183 which corresponds to U.S. application Ser. No. 254,672, filed Apr. 16, 1981 and 1,470,191 which corresponds to U.S. Pat. No. 4,012,739, filed Mar. 15, 1977. In fact a plurality of sets of wells, each set being supplied from a respective photoconductive diode similar to diode 1 in FIG. 1, may be provided side-by-side on the same slice to form a two-dimensional array. Each set may then be provided with its corresponding shift-register structure extending between the wells of the set and the wells of the adjacent set. Alternatively corresponding wells of each set may themselves constitute respective stages of a corresponding shift register structure extending at right angles to the direction in which the wells of each set themselves extend. If the output of each resulting shift register structure is connected to the input of a respective amplifier corresponding to one of the amplifiers 12 of FIG. 1 then, if after exposure to illumination the various photoconductive diodes are masked and the contents of the various shift-register structures are clocked out simultaneously, the contents of the wells corresponding to each of the photoconductive diodes will be presented in parallel to the amplifier inputs in succession.

I claim:

1. An apparatus for producing a digital representation of the time integral of an electric current comprising:
    a plurality of capacitive elements forming a sequence of capacitive elements, each subsequent capacitive element having a capacitance which is $B^{N-1}$ times the capacitance of a preceding element;
    an input terminal for coupling said electric current to a first of said capacitive elements;
    means for comparing the voltage across each capacitive element with a predetermined value of voltage;
    coupling means for coupling each remaining capacitive element to said input terminal when a next capacitive element of said sequence receives a voltage equal to said predetermined voltage, whereby each capacitive element will be sequentially connected;
    means for identifying the last of said capacitive elements to be connected to said input terminal and for providing a digital code representation having N possible values of the voltage on said last capacitive element, which is a function of the logarithmic value to the base B of said last capacitive element voltage; and,
    means for periodically discharging said capacitive elements.

2. Apparatus as claimed in claim 1, wherein the coupling means comprises a coupling from said input to the first element of the sequence and a voltage-level responsive coupling from each element of the sequence to the next element of the sequence, which voltage level responsive coupling is conductive if the voltage level at its input is said predetermined voltage value and substantially non-conductive if the voltage level at its input is less than said predetermined voltage value.

3. The apparatus of claim 1 comprising means for inhibiting further charging of each capacitive element which receives said predetermined voltage.

4. A method of producing a digital representation of the time integral of an electric current comprising:
    charging a capacitive element of a sequence of capacitive elements with said electric current until a predetermined voltage is reached;
    charging in sequence additional capacitive elements with said electric current each time a previous capacitive element is charged to said predetermined voltage capacitive elements having a capacitance which is $B^{N-1}$ times the capacitance of a preceding element;
    identifying with a digital representation the last of said capacitive elements charged;
    representing the deviation of the voltage on said identified capacitive element from a reference voltage as a digital value having N possible values, which is a function of the logarithmic value to the base B of said last capacitive element voltage; and
    discharging said capacitive elements on a periodic basis.

5. The method of claim 4 comprising inhibiting further charging of each capacitive element which charges to said predetermined voltage.

6. An apparatus for producing a digital representation of the time integral of an electric current comprising:
a plurality of sequentially arranged capacitive elements wherein each subsequent capacitive element has a capacitance which is $B^{N-1}$ times the capacitance of a next preceding capacitive element in the sequence;
an input terminal for said electric current;
voltage-level responsive coupling means coupling said capacitive elements to said input terminal in sequence such that a next capacitive element of said sequence is sequentially connected to the input terminal when it receives a predetermined voltage;
means for periodically setting the voltage across said capacitive elements to a reference voltage value, and
means for identifying the last of said capacitive elements to be connected to said input terminal in a given period and for providing a digital code representation having N possible values of the voltage on said last capacitive element, which is a function of the logarithmic value to the base B of said last capacitive element voltage.

7. An apparatus as claimed in claim 6 wherein said voltage-level responsive coupling means directly couples a first capacitive element of the sequence to said input terminal and selectively couples second, third and so on capacitive elements in the sequence to said input terminal as each next preceding capacitive element is charged to said predetermined voltage.

8. An apparatus as claimed in claim 6 wherein said means for providing said digital code representation comprises A/D converter means triggered to provide said digital code at a time subsequent to said given period.

9. An apparatus as claimed in claim 8 further comprising a second input terminal for periodically supplying a trigger signal to operate said A/D converter means and a third input terminal for periodically supplying reset pulses to control said voltage setting means, said trigger signal and said reset pulses occurring at different instants of time.

10. An apparatus as claimed in claim 8 wherein said A/D converter means has a logarithmic characteristic to the base B, and wherein N is the number of possible values of the output of the A/D converter means.

* * * * *